United States Patent [19]
Yero

[11] Patent Number: 6,049,497
[45] Date of Patent: Apr. 11, 2000

[54] ELECTRICALLY MODIFIABLE MULTILEVEL NON-VOLATILE MEMORY COMPRISING INTERNAL REFRESH MEANS

[75] Inventor: Emilio Miguel Yero, Aix-En-Provence, France

[73] Assignee: SGS-Thomson Microelectronics S.A., Saint Genis, France

[21] Appl. No.: 08/957,715

[22] Filed: Oct. 24, 1997

[30]     Foreign Application Priority Data

Oct. 25, 1996 [FR] France .................................. 96 13290

[51] Int. Cl.$^7$ ....................................................... G11C 8/00
[52] U.S. Cl. ............... 365/222; 365/185.11; 365/185.29; 365/189.07; 365/218; 365/230.03
[58] Field of Search .............................. 365/222, 189.07, 365/230.03, 185.11, 185.29, 218

[56]              References Cited

U.S. PATENT DOCUMENTS 5,251,177  10/1993  Akamatsu et al. ....................... 365/222
5,283,885   2/1994  Hollerbauer ........................ 365/222 X

FOREIGN PATENT DOCUMENTS 0 685 852  12/1995  European Pat. Off. .
2 687 811   8/1993  France .

Primary Examiner—Do Hyun Yoo
Attorney, Agent, or Firm—Wolf, Greenfield & Sacks, P.C.

[57]            ABSTRACT

Disclosed is an electrically modifiable, multilevel non-volatile memory including internal refresh means. If a memory with n sectors is considered, only n−1 sectors are allocated simultaneously to the storage of the data elements, the remaining sector or refresh sector is used to receive the duplicated data from one of the n−1 sectors assigned simultaneously to the storage of the data elements. After each duplication, the duplicated sector is replaced by said refresh sector and itself becomes the new refresh sector, in such a way that that all the n sectors, in turn, take part in the refresh operation.

29 Claims, 3 Drawing Sheets

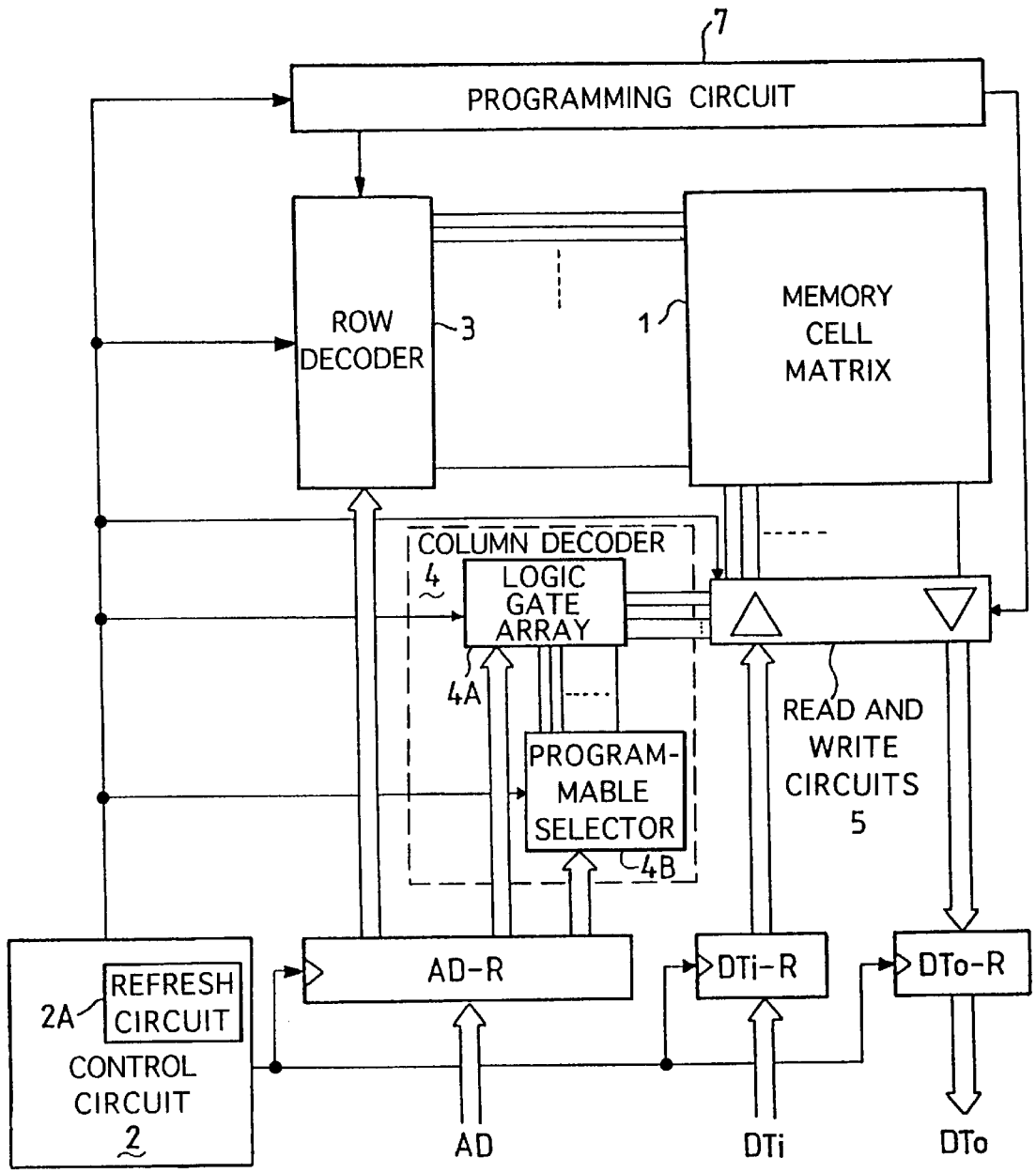
FIG_1

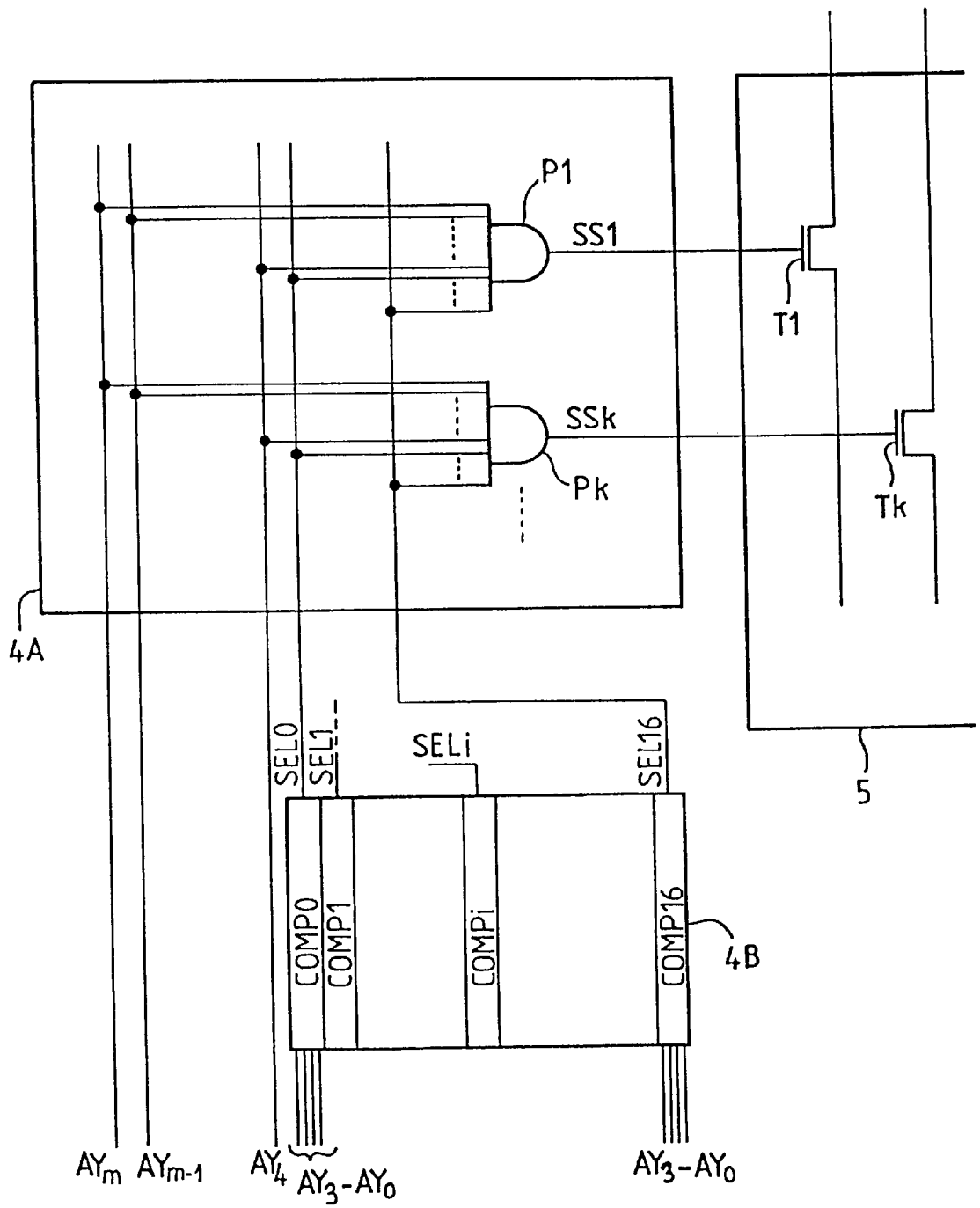
FIG_2

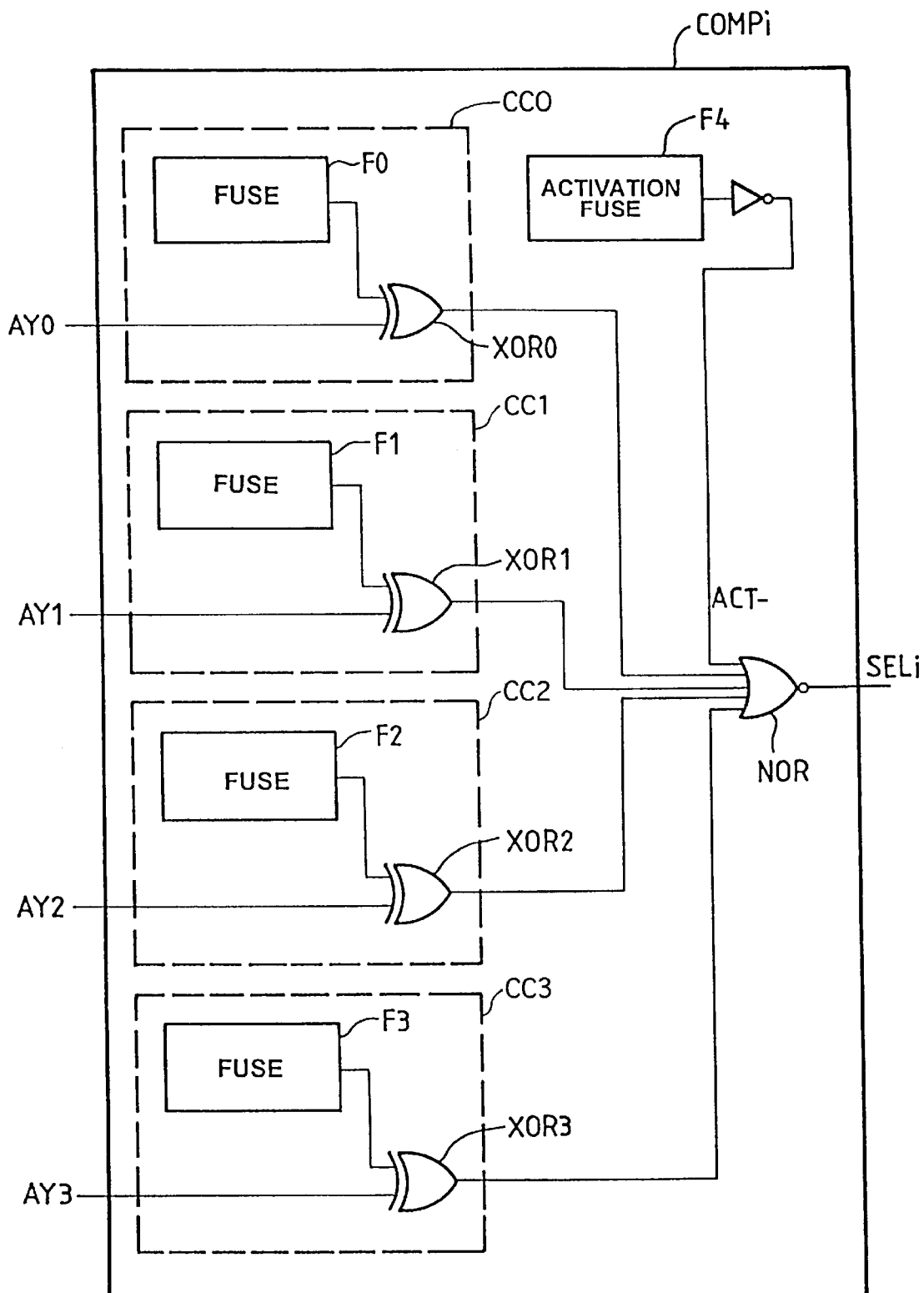
FIG_3

ELECTRICALLY MODIFIABLE MULTILEVEL NON-VOLATILE MEMORY COMPRISING INTERNAL REFRESH MEANS

BACKGROUND OF THE INVENTION

1. Field of the Invention

The invention relates to an electrically modifiable multilevel non-volatile memory having internal refresh means. The invention can be applied especially in the field of memories of large capacities in the range of several tens of megabits.

2. Discussion of Related Art

There are several techniques for increasing the density of memories. One of them consists of the storage of several information bits in a single memory cell. These are then called multilevel memories. The standard memories store one information bit per memory cell, namely one of two programming states. These states correspond to the presence or absence of electrical charges in the floating gates of the transistors constituting the elementary memory cells. The multilevel memories for their part are used to store a greater number of programming states per memory cell.

The patent FR 0 340 107 describes an electrically modifiable non-volatile multilevel memory. Each cell of the memory is capable of storing n possible programming states, with n at least equal to three. These different programming states are obtained by bringing about a variation in the conduction threshold of the floating-gate transistor that forms the memory cell. To obtain this variation of the conduction threshold, the cell is programmed in varying degrees by bringing about a variation of the intensity of the programming, namely either the voltage applied to the cell or the duration of application of the voltage. For the reading of information elements contained in the memory, a current or a voltage that is a function of the programming state of the cell is compared with n−1 reference values in order to deduce therefrom the state of programming of the memory cell among n possible states.

However, the large number of programming states in a multilevel memory and the restricted size of the ranges of voltage or current of these states may then raise problems.

Indeed, it may happen that uncontrolled shifts of electrical charges occur during the operation of programming or erasure of the memory. For example, during the programming of a memory cell of a FLASH EPROM type multilevel memory, a high-voltage Vpp is applied to the word line connected to the control gate of the cell and a lower voltage Vp is applied to the bit line connected to the drain of the cell. The sources of all the cells belonging to the same sector are connected to the ground during the programming. The cells connected to the same word line are then subjected to an electrical field that may be responsible for a shifting of electrical charges and the loss of a programming state if the size of the range of voltage or current of this state is relatively small.

A loss of electrical charges may also occur in read mode at a lower level than in write mode. This does not raise any major problems for a standard memory for the deterioration of the conduction thresholds of the cells is low. However it may be more troublesome for multilevel memories.

To overcome these problems of loss of level, it is indispensable to regularly refresh the memory cells of the multilevel memory.

In a standard way, the operation for refreshing the memory could be performed under the control of a control unit external to the memory. Any access to the memory would then be made impossible during the refresh operation.

Another possible approach would consist of a memory comprising a main matrix of non-volatile memory cells and a secondary matrix of static cells designed to temporarily store data elements of the main matrix. The size of the secondary matrix would, for example, be equal to that of a sector of the main matrix. The refresh operation, which would be done by means internal to the memory, would comprise the following two steps: a step for the duplication of the data elements of a sector of the main matrix in the secondary matrix and a step for the refreshing of the data elements of the duplicated sector of the main matrix. During the refresh step, the data elements of the sector being refreshed would then be accessible in read mode from the secondary matrix. In this exemplary embodiment, the secondary matrix consists of static memory cells in order to minimize the data duplication time.

However, this approach has three major drawbacks:

1. the memory has two different types of memory cells, hence cells of two different technologies in one and the same integrated circuit; this raises problems of cost and manufacture;
2. the data elements to be refreshed undergo a relatively lengthy processing in two steps: a duplication step and a refresh step; and
3. during the refreshing of the memory, the data elements are duplicated in a buffer memory that is volatile. This makes the memory vulnerable to power cuts.

SUMMARY OF THE INVENTION

The aim of the invention therefore is to propose a multilevel memory with internal refreshing comprising solely non-volatile memory cells in which the number of steps performed in the data elements to be refreshed is limited.

An object of the invention is an electrically modifiable non-volatile memory comprising a matrix of memory cells, each capable of storing at least two information bits, this matrix being divided into n data storage sectors, the memory further comprising means for addressing and programming of the matrix, the entire unit being controlled by a control circuit comprising refresh means wherein, in the matrix, only n−1 sectors are allocated simultaneously to the storage of the data elements, the remaining sector or sector to be refreshed (hereinafter called the refresh sector) being then available for refresh purposes for the duplication of one of these n−1 sectors simultaneously assigned to the storage of the data elements and wherein, after each duplication, the duplicated sector is replaced by this refresh sector and itself becomes the new refresh sector in such a way that all the n sectors, in turn, take part in the refresh operation.

Thus, the data elements of the sector to be refreshed undergo only one duplication step.

Advantageously, to refresh one sector among the n−1 sectors simultaneously assigned to the storage of the data elements, the following steps are performed:

(a) the duplication of the data elements of the sector to be refreshed in the refresh sector;
(b) the modification of the addresses of the data elements of the duplicated sector so that they point to the data elements of the refresh sector;
(c) the erasure of the duplicated sector which becomes the new refresh sector.

To carry out the step (b), the addressing means of the matrix comprise programmable means for the reorganization, after duplication, of the pointing indication provided by these addresses, that corresponded to the duplicated sector, so that they point to the new sector that has replaced it.

Preferably, the programmable means comprise n comparison blocks, each comparison block being associated with a sector of the matrix, to reorganize the addresses of the sectors of the memory.

In a preferred embodiment, it is provided that, at each duplication operation, the refresh sector and the sector to be duplicated are physically contiguous so as to obtain a rotating refresh of the sectors of the memory.

BRIEF DESCRIPTION OF THE DRAWINGS

Other features and advantages of the invention shall appear from the following detailed description, made with reference to the appended drawings, of which:

FIG. 1 shows an exemplary embodiment of a memory according to the invention;

FIG. 2 shows a detailed drawing of an addressing structure according to the invention; and FIG. 3 shows a drawing of a block for the comparison of the addressing structure according to the invention.

MORE DETAILED DESCRIPTION

FIG. 1 shows an exemplary structure of a FLASH EPROM memory adapted in order to implement the invention.

The memory comprises a matrix 1 of memory cells connected to a row decoder 3 and a column decoder 4 associated with read and write circuits 5. The writing of the matrix 1 is done by a programming circuit 7 essentially formed by an oscillator, a voltage pull-up circuit and a ramp generator.

The decoders 3 and 4 are connected to an address register AD-R. The read and write circuits 5 are connected respectively to an output data register DTo-R and an input data register DTi-R. The registers AD-R, DTo-R and DTi-R communicate with the exterior of the memory through an interface (not shown). The registers AD-R and DTi-R respectively receive the addresses AD and data elements DTi while the register DTo-R delivers data elements DTo.

The assembly is controlled by a control circuit 2. The circuit 2 will be set up, for example, by a programmable logic array (PLA) designed to give the control signals to the different circuits of the memory.

The control circuit 2 furthermore comprises a refresh circuit 2A designed to carry out the memory refresh operations.

To implement the invention, the matrix 1 is provided with an additional data storage sector and the column decoder 4 comprises programmable selector 4B for the selection of the sectors of the matrix 1. The column decoder 4 and the programmable selector 4B are described in detail hereinafter in the description.

According to the invention, if we consider a memory whose matrix 1 comprises n data storage sectors, n−1 sectors are assigned simultaneously to the storage of the data elements and the remaining sector called a refresh sector is designed to receive the duplicated data elements of one of the n−1 sectors. Furthermore, the refresh operation which is essentially an operation of duplication is performed sector by sector and all the n sectors of the matrix become, in turn, the refresh sector.

The refreshing of the memory takes place as follows: it is assumed first of all that the sector n is the refresh sector. This sector is preferably vacant. It is also chosen to start the refreshing of the memory by the sector n−1 which corresponds to the sector that is physically contiguous to the refresh sector. Thus, the sectors of the memory will be refreshed in rotation.

In a first stage, the data elements of the sector n−1 are duplicated in the sector n. The data elements that were stored in the sector n−1 are then available in the sector n. The column decoder 4 is then, in a second stage, reprogrammed so that the addresses of these data elements thereafter point to the duplicated data elements of the sector n. Then, the sector n−1 is erased and becomes the new refresh sector. The refresh operation is then continued by the duplication of the data elements of the sector n−2 in the new refresh sector, namely the sector n−1 and so on and so forth.

The fact that the sector used for the refresh operation is not always the same makes it possible to ensure high reliability for the system.

According to the invention, the column decoder 4 of the matrix 1 comprises programmable selector 4B to reorganize the pointing indication provided by the addresses of the data elements of the duplicated sector so that they are oriented towards the sector that has replaced it. The column decoder is illustrated in detail in FIG. 2.

In this exemplary embodiment of the decoder 4, the matrix of the memory considered has seventeen sectors, sixteen of which are assigned simultaneously to the storage of data elements. According to the invention, this memory has only sixteen sectors that are visible from the viewpoint of the user. Thus, there are only four address bits to select one sector of the matrix.

The column decoder 4 consists of an array of logic gates 4A and programmable selector 4B. It enables the selection of the bit lines of the matrix 1 as a function of the column address $AY_m$–$AY_0$. In the example of FIG. 2, the address bits AY3–AY0 represent a sector of the matrix 1.

The programmable selector 4B comprises comparison blocks COMPi, each being associated with a sector of the matrix 1. Each comparison block receives the sector address bits $AY_0$–$AY_3$ and delivers a sector selection signal SELi. In practice, each block compares the sector address $AY_0$–$AY_3$ with a sector address stored in the block. If the two addresses are identical, the concerned comparison block COMPi delivers a selection signal SELi presenting a logic "1".

The selection signals SELi as well as the address bits AY4–AYm are then processed by the logic gate array 4A to select one or more bit lines of the matrix 1. In the example of FIG. 2, this array comprises AND type logic gates Pk with m+14 inputs each delivering a selection signal SSk. The selection signals SSk enable the selection of the bit lines of the matrix 1 by means of passage transistors Tk provided for in the read and write circuit 5.

Inverters, not shown in FIG. 2, are also planned on a certain number of inputs of the logic gates Pk. These inverters are positioned so as to activate a different selection signal for each possible combination of the input signals AY4–AYm and SEL0–SEL16.

Since there are seventeen sectors available in the matrix and since the sector address $AY_0$–$AY_3$ includes only four bits, there is provided an additional bit called an activation bit to distinguish the refresh sector from the sixteen other sectors of the matrix. An activation bit is made to correspond with each sector address prerecorded in the comparison block, this activation bit indicating whether the sector can be accessed or not by the user. Since the refresh sector is no longer accessible, the activation bit pertaining thereto is at "0". There will always be sixteen sectors whose associated activation bit is at "1" and one sector whose activation bit is at "0".

The working of the programmable selector 4B is illustrated by the following table: at the outset, the sector 16 corresponds to the refresh sector, and the activation bit associated with it in the comparison block COMP16 is at "0". Each of the first sixteen sectors has its own address and each of their associated activation bits is at "1". After each duplication operation, the address and the activation bit of the comparison blocks corresponding to the duplicated sector and to the refresh sector are reprogrammed.

| Sector | Sector to be refreshed 15 | | Sector to be refreshed 14 | | Sector to be refreshed 13 | |
|---|---|---|---|---|---|---|
|  | Add | Bit | Add | Bit | Add | Bit |
| 0 | 0000 | 1 | 0000 | 1 | 0000 | 1 |
| 1 | 0001 | 1 | 0001 | 1 | 0001 | 1 |
| 2 | 0010 | 1 | 0010 | 1 | 0010 | 1 |
| 3 | 0011 | 1 | 0011 | 1 | 0011 | 1 |
| 4 | 0100 | 1 | 0100 | 1 | 0100 | 1 |
| 5 | 0101 | 1 | 0101 | 1 | 0101 | 1 |
| 6 | 0110 | 1 | 0110 | 1 | 0110 | 1 |
| 7 | 0111 | 1 | 0111 | 1 | 0111 | 1 |
| 8 | 1000 | 1 | 1000 | 1 | 1000 | 1 |
| 9 | 1001 | 1 | 1001 | 1 | 1001 | 1 |
| 10 | 1010 | 1 | 1010 | 1 | 1010 | 1 |
| 11 | 1011 | 1 | 1011 | 1 | 1011 | 1 |
| 12 | 1100 | 1 | 1100 | 1 | 1100 | 1 |
| 13 | 1101 | 1 | 1101 | 1 | 1101 | 1 |
| 14 | 1110 | 1 | 1110 | 1 | 1101 | 0 |
| 15 | 1111 | 1 | 1110 | 0 | 1110 | 1 |
| 16 | 1111 | 0 | 1111 | 1 | 1111 | 1 |

Add = address
Bit = activation bit

This table summarizes the various operations performed on the addresses and the activation bits of the different comparison blocks for the refreshing of the sectors 15, 14 and 13.

At the beginning of the refreshing of the sector 15, the comparison blocks COMP15 and COMP16 contain the same address: 1111. However, the sector 16 which corresponds to the refresh sector should not be accessible to the user during the refreshing of the sector 15. The activation bit of the block COMP16 is therefore at "0". During the refresh operation, the data elements of the sector 15 are duplicated in the sector 16.

At the end of the duplication operation, the activation bit of the comparison block COMP15 is placed at "0" and the sector 15 becomes the new refresh sector. The address of the sector 14 is also copied in the block associated with the sector 15 in order to refresh the sector 15. Furthermore, the activation bit of the block COMP16 is set at "1" and the addresses of the data elements that were contained in the sector 15 henceforth point to the data elements of the sector 16.

For the refreshing of the sector 14, the data elements of the sector 14 are duplicated in sector 15. At the end of this duplication operation, the activation bit of the block COMP15 is set at "1" while the activation bit of the block COMP14 is set at "0". The address stored in the comparison block COMP14 is furthermore modified in order to refresh the sector 13.

In this embodiment, where the refresh mode is rotating, the position of the activation bit at zero is used to determine the last sector of the matrix that has been refreshed. Thus, after each time that the memory is put into operation, it is possible to continue the refreshing of the memory from the last sector refreshed.

FIG. 3 illustrates a comparison block COMPi included in the programmable selector 4B. Each comparison block comprises four comparison cells CC0 . . . CC3, each used to compare a bit of the sector address AY0–AY3 with a bit prerecorded in the block. For example, the comparison cell CC0 compares the address bit AY0 with an address bit stores in a fuse F0. If the two address bits are identical, the comparison cell delivers a "0" at output. Otherwise it delivers a "1". This is also the case for the cells CC1, CC2 and CC3.

The comparison cell CC0 consists of an XOR0 type exclusive-OR logic gate receiving the address bit AY0 and the address bit given by the fuse F0 at input. The comparison cells CC1, CC2 and CC3 are identical to the cell CC0. The outputs of these cells are connected to the inputs of a NOR type logic gate. The NOR logic gate also receives an activation signal ACT- at a fifth input. This signal is the reverse signal of a signal delivered by a fuse F4. The fuse F4 memorizes the activation bit of the comparison block. The NOR gate of the comparison block COMPi delivers the selection signal SELi at output. The signal SELi is equal to "1" if all its inputs are at "0". In particular, the activation bit is obligatorily equal to "1" in order that the NOR gate may deliver a "1".

By this means of comparison, if the address AY0–AY3 is equal to the address prerecorded in the comparison block COMPi and if the activation bit contained in this block is equal to "1", then the selection signal SELi has a high level and selects the bit line or lines associated with it.

The fuses of the comparison blocks are preferably FLASH EPROM or $E^2$PROM type memory cells. Means internal to the memory are planned for the programming of these fuses as well as for the duplication of the data elements in the refresh sector.

Furthermore, if the user seeks to write a data element in the sector being refreshed, the duplication operation is temporarily stopped. The data element is written in the sector that was being duplicated, and then the duplication operation is continued. At the end of duplication, a verification operation compares the contents of the duplicated sector with those of the refresh sector.

Thus, if the written data element were to relate to a part of the sector that had not yet been duplicated at the time of the write operation, then it means that this data element was subsequently duplicated in the refresh sector and the verification operation would therefore detect no anomaly. If this data element were to relate to an already duplicated part of the sector, then the verification operation would detect an anomaly between the two sectors and the duplication operation would then be repeated. In a more elaborate version, it can provided that only the new data element will be rewritten in the refresh sector.

Naturally, the refreshing of the memory described in this application can be adapted to memories other than multilevel memories.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electrically modifiable non-volatile memory comprising:
   a matrix of memory cells, each capable of storing at least two information bits, said matrix being divided into n data storage sectors, n−1 sectors being allocated simultaneously to the storage of data elements, the remaining sector being a refresh sector for duplication of one of said n−1 sectors;
   means for addressing and programming of said matrix; and
   a control circuit controlling the memory, including:
      refresh means for the duplication of one of said n−1 sectors in said refresh sector, and after each duplication, reassigning a duplicated sector as a new refresh sector in such a way that all the n sectors take part in a refresh operation.

2. A memory according to claim 1 wherein said refresh means includes:
   means for duplicating the data elements of a sector to be refreshed into the refresh sector;
   means for modifying addresses of the data elements of the duplicated sector so that said addresses point to data elements of the refresh sector; and
   means for erasing the duplicated sector which becomes the new refresh sector.

3. A memory according to claim 2, wherein the means for modifying addresses includes programmable means for a reorganization, after duplication, of the pointing indication provided by said addresses, that corresponded to the duplicated sector, so that the pointing is oriented towards the new refresh sector that has replaced the duplicated sector.

4. A memory according to claim 3, wherein the programmable means includes n comparison blocks, each comparison block being associated with a sector of the matrix, to compare addresses of data elements contained in the memory with sector addresses recorded in each comparison block.

5. A memory according to claim 1, wherein the refresh sector and the sector to be duplicated are physically contiguous.

6. A refresh control circuit for a memory having a plurality of sectors, comprising:
   an addressing circuit providing an address for each of said sectors, wherein two sectors have the same address;
   a refresh flag identifying one of said two sectors as a refresh sector and another of said two sectors as a duplication sector; and
   a refresh circuit for duplicating data values from said duplication sector to said refresh sector.

7. The refresh control circuit according to claim 6, wherein said addressing circuit changes addresses for said sectors after data values have been duplicated.

8. The refresh control circuit according to claim 7, wherein said addressing circuit includes an address changing circuit for changing an address of said duplication sector to an address of another one of said sectors; and
   wherein said refresh control circuit further comprises a refresh flag changing circuit for identifying said duplication sector as a new refresh sector, and for identifying said another one of said sectors as a new duplication sector.

9. A memory comprising
   a memory array having a plurality of sectors; and
   a refresh circuit including:
      an addressing circuit providing an address for each of said sectors, wherein two sectors have the same address;
      a refresh flag identifying one of said two sectors as a refresh sector and another of said two sectors as a duplication sector; and
      a refresh circuit for duplicating data values from said duplication sector to said refresh sector.

10. The memory according to claim 9, wherein said addressing circuit changes addresses for said sectors after data values have been duplicated.

11. The memory according to claim 10, wherein said addressing circuit includes an address changing circuit for changing an address of said duplication sector to an address of another one of said sectors; and
   wherein said refresh circuit further comprises a refresh flag changing circuit for identifying said duplication sector as a new refresh sector, and for identifying said another one of said sectors as a new duplication sector.

12. The memory according to claim 9, further comprising an access control circuit receiving an access address and accessing a memory cell in said memory array based upon said access address and addresses assigned to said sectors by said addressing circuit.

13. The memory according to claim 12, wherein said access control circuit includes
   a sector selector circuit for selecting a sector based upon said access address and addresses assigned to said sectors.

14. The memory according to claim 13, wherein said sector selector circuit includes:
   a plurality of comparison circuits corresponding to said plurality of sectors, each comparison circuit comparing a stored address provided by said addressing circuit for a corresponding sector and said access address, and outputting a comparison result; and
   a logic gate array receiving and combining comparison results from the plurality of comparison circuits to select a sector.

15. The memory according to claim 14, wherein said plurality of comparison circuits include a refresh flag identifying the refresh sector, and wherein the comparison result of a comparison circuit is based upon a value of the refresh flag.

16. The memory according to claim 13, further comprising a programming circuit for providing said access address to said sector selection circuit and for programming said memory cell in said memory array at said access address.

17. The memory according to claim 16, wherein said programming circuit programs said memory cell to one of at least three values.

18. A method for refreshing a memory having a plurality of sectors, comprising the steps of:
   selecting a first one of the sectors as a refresh sector;
   duplicating data elements from a second one of the sectors to the refresh sector; and
   selecting said second one of the sectors as a new refresh sector.

19. The method of claim 18, wherein said first selecting step includes the steps of:
   providing an address for each of said sectors, wherein said first one and said second one of the sectors have the same address;
   identifying said first one of said sectors as the refresh sector; and
   identifying said second one of said sectors as a duplication sector; and wherein the duplicating step includes the step of duplicating data values from said duplication sector to said refresh sector.

20. The method of claim 19, further comprising the step of changing addresses for said sectors after data values have been duplicated.

21. The method of claim 20, wherein said changing step includes changing an address of said duplication sector to an address of a third one of said sectors; and wherein said method further comprises the step of:
identifying said third one of said sectors as a new duplication sector.

22. The method of claim 21, wherein each of the plurality of sectors is selected as the duplication sector and the refresh sector according to a predetermined order.

23. A method for operating a memory array having a plurality of sectors, the method comprising the steps of:

setting a plurality of sector addresses corresponding to said plurality of sectors;

receiving an access address for at least one memory cell within one of said sectors;

selecting one of said sectors based upon said sector addresses and said access address;

acting on said at least one memory cell based upon selection of one of said sectors; and refreshing data values in one of said sectors, the refreshing step including the steps of:
selecting a first one of the sectors as a refresh sector;
duplicating data elements from a second one of the sectors to the refresh sector; and
selecting said second one of the sectors as a new refresh sector.

24. The method of claim 23, wherein said step of selecting a refresh sector includes the steps of:

providing an address for each of said sectors, wherein said first one and said second one of the sectors have the same address;

identifying said first one of said sectors as the refresh sector; and identifying said second one of said sectors as a duplication sector; and wherein the duplicating step includes the step of duplicating data values from said duplication sector to said refresh sector.

25. The method of claim 24, further comprising the step of changing addresses for said sectors after data values have been duplicated.

26. The method of claim 25, wherein said changing step includes changing an address of said duplication sector to an address of a third one of said sectors; and wherein said method further comprises the step of:
identifying said third one of said sectors as a new duplication sector.

27. The method of claim 23, wherein said setting step includes storing an address for each of said sectors, wherein a single address is stored for two sectors, and setting a flag identifying one of said first one and said second one of the sectors as the refresh sector.

28. The method of claim 27, wherein said step of selecting one of said sectors includes the steps of:

comparing said access address to each of said stored addresses; and selecting a corresponding sector having a stored address which matches said access address, if said flag does not identify said corresponding sector as the refresh sector.

29. The method of claim 23, wherein said acting step includes programming said at least one memory cell to one of at least three values.

* * * * *

UNITED STATES PATENT AND TRADEMARK OFFICE
CERTIFICATE OF CORRECTION

PATENT NO. : 6,049,497  
DATED : April 11, 2000  
INVENTOR(S) : Emilio Miguel Yero Page 1 of 1

It is certified that error appears in the above-identified patent and that said Letters Patent is hereby corrected as shown below:

Title page,
Item [73] should read as follows:
[73] Assignee: SGS - Thomson Microelectronics S.A., Gentilly, France Signed and Sealed this Eleventh Day of September, 2001

*Attest:*

NICHOLAS P. GODICI
*Attesting Officer*   *Acting Director of the United States Patent and Trademark Office*